US012635046B2

(12) United States Patent
Soer

(10) Patent No.: US 12,635,046 B2
(45) Date of Patent: May 19, 2026

(54) TUNABLE WHITE LIGHTING SYSTEM WITH HIGH COLOR FIDELITY AND ADJUSTABLE MELANOPIC CONTENT

(71) Applicant: LUMILEDS LLC, San Jose, CA (US)

(72) Inventor: Wouter Soer, Eindhoven (NL)

(73) Assignee: LUMILEDS LLC, San Jose, CA (US)

( * ) Notice: Subject to any disclaimer, the term of this patent is extended or adjusted under 35 U.S.C. 154(b) by 617 days.

(21) Appl. No.: 18/030,813

(22) PCT Filed: Oct. 14, 2021

(86) PCT No.: PCT/US2021/055063
§ 371 (c)(1),
(2) Date: Apr. 7, 2023

(87) PCT Pub. No.: WO2022/086792
PCT Pub. Date: Apr. 28, 2022

(65) Prior Publication Data
US 2023/0389146 A1 Nov. 30, 2023

Related U.S. Application Data

(60) Provisional application No. 63/094,096, filed on Oct. 20, 2020.

(51) Int. Cl.
*H05B 45/20* (2020.01)
*F21K 9/64* (2016.01)
(Continued)

(52) U.S. Cl.
CPC .............. *H05B 45/20* (2020.01); *F21K 9/64* (2016.08); *H01L 25/0753* (2013.01); *H10H 20/8511* (2025.01); *F21Y 2113/13* (2016.08)

(58) Field of Classification Search
CPC ....... F21K 9/64; H01L 25/0753; H05B 45/20; H05B 47/10; H05B 45/00; H05B 33/12;
(Continued)

(56) References Cited

U.S. PATENT DOCUMENTS

| 11,289,630 B2 * | 3/2022 | Soer ................... H10H 20/8513 |
| 2007/0223219 A1 * | 9/2007 | Medendorp ........... H05B 47/10 |
| | | 257/E33.001 |

(Continued)

FOREIGN PATENT DOCUMENTS

| JP | 2020098855 A | 6/2020 |
| JP | 2020136597 A | 8/2020 |

(Continued)

OTHER PUBLICATIONS

The extended European search report corresponding to 21883589.0 / 4232745, Sep. 18, 2024, 8 pages.

(Continued)

*Primary Examiner* — Chad M Dicke
*Assistant Examiner* — Priya M Rampersaud

(57) ABSTRACT

A light emitting device includes four primary light sources, the first light source emits light with an emission spectrum having a first peak in a wavelength in a range of 420-440 nm and a second peak in a wavelength range of 530-580 nm, the second light source emits light with an emission spectrum having a peak in a wavelength in a range of 470-500 nm, the third light source emits light with an emission spectrum having a peak in a wavelength range of 530-580 nm, and the fourth light source emits light with an emission spectrum having a peak in a wavelength range of 580-660 nm.

20 Claims, 12 Drawing Sheets

(51) Int. Cl.

| | |
|---|---|
| *F21Y 113/13* | (2016.01) |
| *H01L 25/075* | (2006.01) |
| *H10H 20/851* | (2025.01) |

(58) Field of Classification Search

CPC ... H05B 47/155; F21V 23/04; F21Y 2105/16; F21Y 2113/13; F21Y 2113/30; F21Y 2105/14; F21Y 2113/10; F21Y 2105/00; H10H 20/851; H10H 20/8513; H10H 20/8512; H10H 20/857; H10H 20/85; H10H 20/0361; H10H 20/8506; H10H 20/8511

See application file for complete search history.

(56) References Cited

U.S. PATENT DOCUMENTS

| | | | | |
|---|---|---|---|---|
| 2009/0080185 | A1* | 3/2009 | McMillan | F21K 9/00 |
| | | | | 362/231 |
| 2012/0099303 | A1* | 4/2012 | Li | H01L 25/0753 |
| | | | | 362/231 |
| 2013/0056765 | A1* | 3/2013 | Thompson | H10H 29/10 |
| | | | | 257/E33.061 |
| 2014/0217915 | A1 | 8/2014 | Shteynberg et al. | |
| 2015/0062892 | A1 | 3/2015 | Krames et al. | |
| 2015/0097200 | A1 | 4/2015 | Bergmann et al. | |
| 2016/0170120 | A1 | 6/2016 | Shani et al. | |
| 2018/0056027 | A1 | 3/2018 | Peeters et al. | |
| 2019/0321501 | A1* | 10/2019 | Barron | H05B 45/20 |
| 2020/0290508 | A1* | 9/2020 | Stigler | H05B 45/20 |

FOREIGN PATENT DOCUMENTS

| | | | |
|---|---|---|---|
| WO | 2020/043649 A1 | 3/2020 | |
| WO | WO-2020111897 A1 * | 6/2020 | ... H05B 47/175 |
| WO | 2022/086792 A1 | 4/2022 | |

OTHER PUBLICATIONS

Notification of Transmittal of the International Search Report and the Written Opinion of the International Searching Authority, or the Declaration, PCT/US2021/055063, Jan. 18, 2022, 9 pages.

* cited by examiner

100

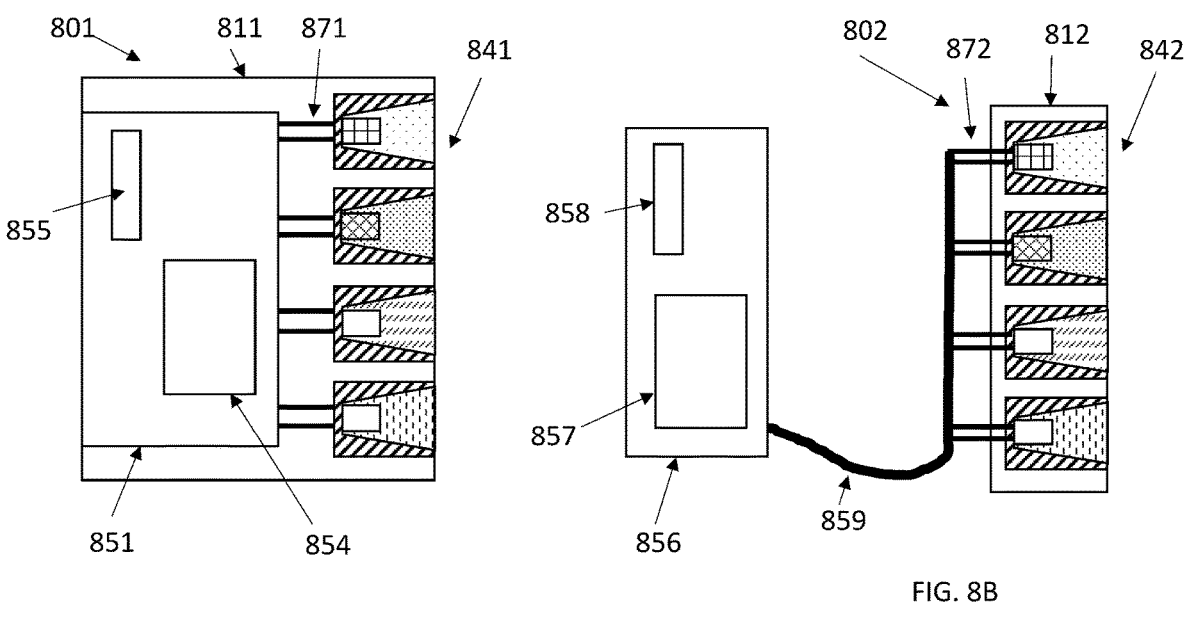
FIG. 8A
FIG. 8B
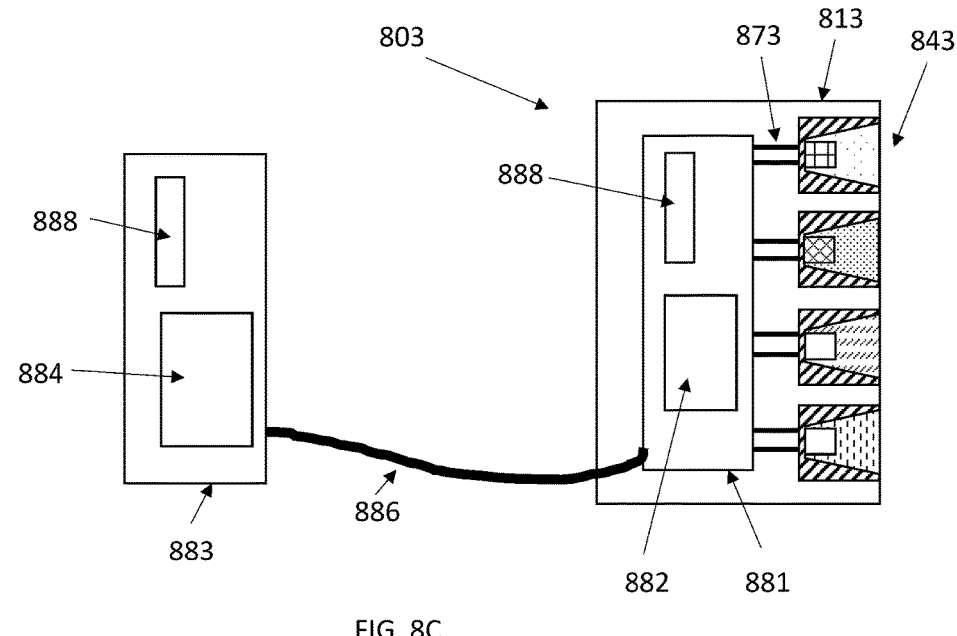
FIG. 8C

TUNABLE WHITE LIGHTING SYSTEM WITH HIGH COLOR FIDELITY AND ADJUSTABLE MELANOPIC CONTENT

CROSS-REFERENCE TO RELATED APPLICATION

This application is a 371 national phase entry of International Application No. PCT/US2021/055063 filed Oct. 14, 2021, which claims benefit of priority to U.S. Application No. 63/094,096 titled "Tunable White Lighting System with High Color Fidelity and Adjustable Melanopic Content" filed Oct. 20, 2020. The above-mentioned applications are incorporated herein by reference their entireties.

FIELD OF THE INVENTION

The disclosure relates generally to lighting devices, and in particular to tunable lighting devices that can change spectral characteristics of emitted light in addition to changing the color point.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors.

SUMMARY

In one aspect, a lighting device is disclosed, the lighting device including a first primary light source, the first primary light source including a first pump die configured to emit first pump light having a peak light emission wavelength in a range of 420-440 nm, and a first downconverter configured to absorb a portion of first pump light and emit a first downconverter light having a peak emission in a wavelength range of 530-580 nm; a second primary light source, the second primary light source including a second pump die configured to emit second pump light having a peak light emission wavelength in a range of 470-500 nm, and a second downconverter configured to absorb a portion of second pump light and emit a second downconverter light having a peak emission in a wavelength range of 495-580 nm; a third primary light source, the third primary light source including a third pump die configured to emit third pump light having a peak light emission wavelength in a range of 440-460 nm, and a third downconverter configured to absorb substantially all third pump light and emit a third downconverter light having a peak emission in a wavelength range of 530-580 nm; and a fourth primary light source, the fourth primary light source including a fourth pump die configured to emit fourth pump light having a peak light emission wavelength in a range of 440-460 nm, and a fourth downconverter configured to absorb substantially all fourth pump light and emit a fourth downconverter light having a peak emission in a wavelength range of 580-660 nm. A portion of unconverted first pump light and first downconverter light may combine to form a first light, a portion of unconverted second pump light and second downconverter light may combine to form a second light, substantially all of the third pump light may be converted to third downconverter light to form a third light, and substantially all of fourth downconverter light may be converted to form a fourth light. The first light may have an MDER less than 0.35. The second light may have an MDER greater than 0.65. The first primary light source may include a first electrical connection for providing a first bias to the first pump die, the second primary light source may include a second electrical connection for providing a second bias to the second pump die, the third primary light source may include a third electrical connection for providing a third bias to the third pump die, and the fourth primary light source may include a fourth electrical connection for providing a fourth bias to the fourth pump die. The first light may have a CIE1976 color point in the range of $0.18<u'<0.4$, $v'<0.42$, the second light may have a color point in the range of $u'<0.18$, $v'>0.25$, the third light may have a color point in the range of $0.18<u'<0.25$, $v'>0.53$, and the fourth light may have a color point in the range of $u'>0.35$, $v'>0.50$. The lighting device may include a controller, the controller configured to independently input a first bias to control an amount of first light, a second bias to control an amount of second light, a third bias to control an amount of third light, and a fourth bias to control an amount of fourth light. The controller may include a memory configured to store one or more sets of predetermined first, second, third, and fourth bias values for providing a combined light formed from the amount of first light, the amount of second light, the amount of third light, and the amount of fourth light, the combined light having a CCT value, a luminous flux value, and one of an Ra value, a TM-30-18 Rf value, an Rcs,h1value, or an MDER value. The combined light may have a CCT value than can be in a range between 2000K and 10000K, an Ra value>80, and an MDER value that can be in a range of 0.25 to 1.39.

In another aspect a lighting device includes a first primary light source configured to emit a first light having a first emission spectrum, the first emission spectrum having a first peak in a wavelength in a range of 420-440 nm and a second peak in a wavelength range of 530-580 nm; a second primary light source configured to emit a second light having a second emission spectrum, the second emission spectrum having a peak in a wavelength in a range of 470-500 nm; a third primary light source configured to emit a third light having a third emission spectrum, the third emission spectrum having a peak in a wavelength range of 530-580 nm; and a fourth primary light source configured to emit a fourth light having a fourth emission spectrum, the fourth emission spectrum having a peak in a wavelength range of 580-660 nm. The first light may have an MDER less than 0.35. The second light may have an MDER greater than 0.65. The first light may have a CIE 1976 color point in the range of 0.18<u'<0.4, v'<0.42, the second light has a color point in the range of u'<0.18, v'>0.25, the third light has a color point in the range of 0.18<u'0.25, v'>0.53, and the fourth light has a color point in the range of u'>0.35, v'>0.50. An adjustable amount of the first light, an adjustable amount of the second light, an adjustable amount of the third light, and an adjustable amount of the fourth light are configured to combine to form a combined light. The combined light may maintain an Ra>90 or Ra>95 for CCT(K) values between 2000K and 10000K. The combined light may have an MDER in the range of 0.25 to 1.39. An MDER of the combined light may be varied between 90% to 110% of a reference source MDER while maintaining a set CCT(K) and an Ra>80, the reference source is a black body radiator below CCT values of 5000K, and a CIE D illuminant above CCT values of 5000K. The first primary light source may include a first electrical connection for providing a first bias to the first pump die, the second primary light source may include a second electrical connection for providing a second bias to the second pump die, the third primary light source may include a third electrical connection for providing a third bias to the third pump die, and the fourth primary light source may include a fourth electrical connection for providing a fourth bias to the fourth pump die. The lighting device may further include a controller electrically connected to each of the first electrical connection, second electrical connection, third electrical connection, and fourth electrical connection, the controller providing the first bias, second bias, third bias, and fourth bias, the controller including a memory, the memory configured to store first, second, third, and fourth bias values for producing a combined light with CCT(K) values in a range of 2000K to 10000K and MDER in a range of 0.25 to 1.39.

In another aspect, a lighting device includes plurality of first primary light sources, each first primary light source including a violet pump die and green phosphor disposed on the violet pump die, the violet pump die and green phosphor contained in a first package; a plurality of second primary light sources, each second primary light source comprising a cyan-blue pump die and a green phosphor disposed on the cyan-blue pump die, the cyan-blue pump die and green phosphor contained in a second package; a plurality of third light sources, each third primary light source comprising a royal-blue pump die and a green phosphor disposed on the royal-blue pump die, the royal-blue pump die and green phosphor contained in a third package; and a plurality of fourth primary light sources, each fourth primary light source comprising another royal-blue pump die and a red phosphor disposed on the another royal-blue pump die, the another royal-blue pump die and red phosphor contained in a fourth package, the first, second, third, and fourth packages are each separate packages.

These and other embodiments, features and advantages of the present invention will become more apparent to those skilled in the art when taken with reference to the following more detailed description in conjunction with the accompanying drawings that are first briefly described.

BRIEF DESCRIPTION OF THE DRAWINGS

FIG. 3 also shows the black body locus from 2,000K to 10,000K.

FIGS. 8A, 8B, and 8C illustrate various example implementations of the lighting device as disclosed herein with a controller for controlling the bias applied to each of the primary light sources.

DETAILED DESCRIPTION

Figure 1A:
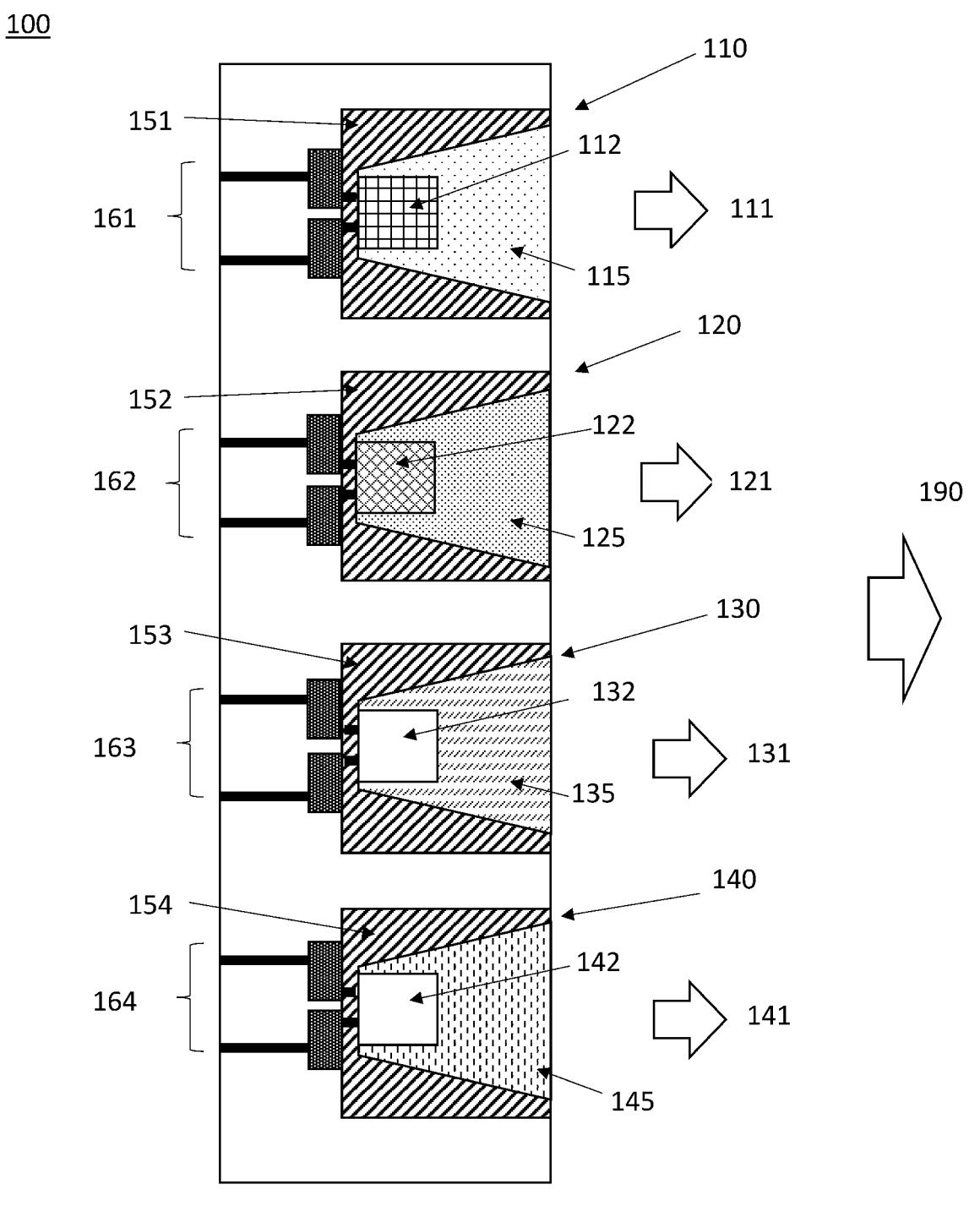
FIG. 1A is a cross-sectional view and FIG. 1B a top plan view illustrating a lighting device according to an example embodiment.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Tunable white light LED systems typically use two or three primary LED colors ("primaries"), and can emit light in a range of correlated color temperatures ("CCTs") contained within the gamut of the primary LED colors used in the system. A basic tunable white LED system with two primaries can represent colors on a straight line in color space (e.g. International Commission on Lighting (the "CIE") 1931 or CIE 1976) between those primaries. A system with three primaries can show any color within the triangular gamut formed by the primaries in color space, enabling tracking of the curved black body locus ("BBL") and showing a wide range of off-BBL colors.

In a tunable white light LED system that uses three primaries, each combination of the three primaries that produces a white, or combination light, having a certain color point and light output has a unique solution in terms of the bias applied to each of the primaries. Therefore, only one spectrum of the white, or combined light, from the three primaries is possible at any one color point. This is a disadvantage when a light source is desired that can change spectral characteristics without changing the color point.

Additionally, with a tunable white light system that uses only three primaries, even if only one spectrum is needed at a given color point, it is not always possible to produce the desired spectra and color range with only three primaries. For example, a high color fidelity as characterized by a color rendering and color fidelity of CRI Ra>95 or TM-30-18 Rf>90 can generally not be sustained over a wide CCT range such as 2000-10000K if only three primaries are used.

More primaries can be added to a tunable white light system to meet these requirements; however, determining which primaries to use and biases to apply in a system with four or more primaries is not straightforward. In addition to the spectral performance targets described above, additional performance targets for tunable white light LED systems typically include luminous efficacy and flux. It is therefore desirable to use the smallest possible number of primaries in order to minimize system complexity and maximize LED utilization, which improves efficiency.

An example of a tunable light source in which it is desirable to change the spectral characteristics of the white, or combined light, without changing the color point is in a light source that can adjust melanopic spectral content at a given color point. In many lighting applications, it is desirable to be able to vary the melanopic illuminance of the emitted spectrum using a tunable lighting system so as to provide conditions suitable for circadian entrainment and to minimize circadian disruption. The ability to adjust melanopic spectral content at a given color point can be used to support circadian entrainment while minimizing visual impact.

The human circadian rhythm is a twenty-four hour cycle in the human physiological process and includes any biological process that displays an endogenous and entrainable oscillation. Entrainment is the interaction between circadian rhythms and the environment, such as the entrainment of circadian rhythms to the daily light-dark cycle determined by the earth's rotation. Light-induced circadian entrainment and other non-visual responses to light are influenced by a photoreceptor as well as rod and cone structures in the eye. Together, these non-visual responses to light can produce a day-like physiological state in the body. Light-induced circadian entrainment generally has a peak spectral sensitivity in the short-wavelength end of the visual spectrum. The melanopic sensitivity range is 447-531 nm full width at half maximum (FWHM) and peaks at a wavelength of 490 nm. This range correlates with the action spectrum for melanopsin, which is the photopigment in the eye expressed by the photoreceptor responsible for light-induced circadian entrainment. The spectrum of the emitted light from a light source may be engineered to create either a gap or a peak at the wavelength ranges coinciding with the melanopic peak sensitivity. Such gaps and peaks may be referred to herein as a "cyan gap" or a "cyan peak."

A light emitting device disclosed herein is a tunable white LED system that can sustain high color fidelity (CRI Ra>95) over a wide CCT range (2000-10000K) and that also provides maximum tunability of melanopic spectral content at a given color point; all while operating at high LED utilization and luminous efficacy. As used herein, the melanopic spectral content, or melanopic content, is measured by the melanopic daylight (D65) efficacy ratio as defined by CIE S026:2018 (the "MDER").

Such a tunable white LED system having the color fidelity and melanopic tuning functionality described above may be achieved using four primary light sources each having a different emission spectrum as disclosed herein. The four primary light sources can be realized with practical LED emitter and phosphor materials. In particular, one of the primary light sources may be pumped by a violet (~430 nm) emitter and another primary light source may be pumped by a blue (~480 nm) emitter. This enables high color fidelity at high CCTs when both primary light sources are used, and MDER tunability by changing the relative contribution of the two primary light sources in the combination light emitted by the tunable white LED system. Both of these first and second primary light sources may also include a green phosphor to improve their utilization when used in combination with the remaining two primary light sources of the four primary light sources, and hence improve efficacy and flux without impairing the color fidelity and melanopic tunability performance.

Figure 1B:
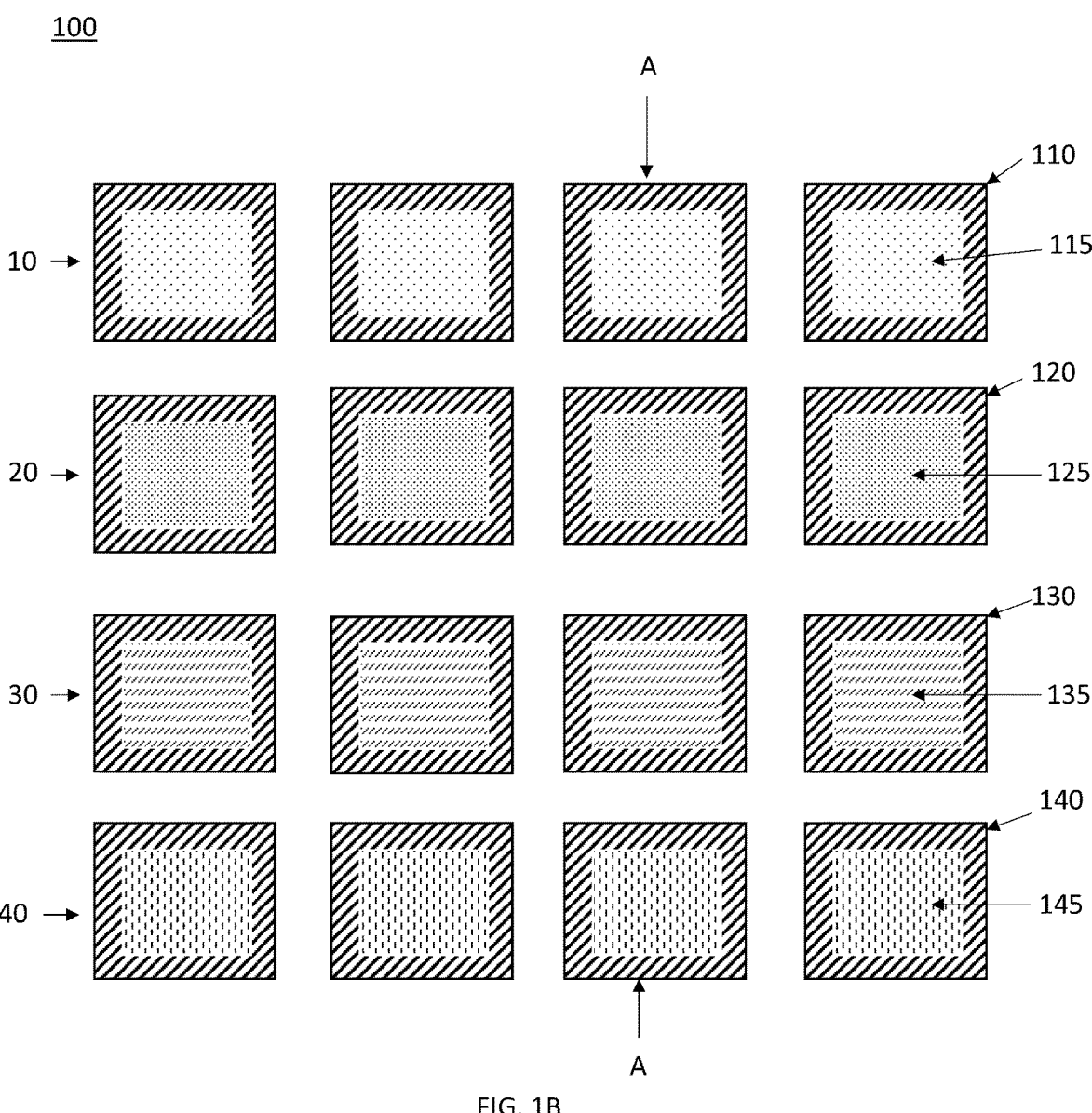

FIG. 1A illustrates a cross-sectional view and FIG. 1B a top plan view of a light emitting device that is a tunable white LED system having the color fidelity and melanopic tuning functionality described above. The cross-sectional view in FIG. 1A is taken through light A-A of FIG. 1B.

Lighting device 100 of FIGS. 1A and 1B includes groups 10, 20, 30 and 40 of four different primary light sources 110, 120, 130, and 140. Each of the four different primary light sources 110, 120, 130, and 140 can be individually addressed, and may connect to a controller, as discussed in more detail below with respect to FIGS. 8A, 8B, and 8C. Although lighting device 100 is illustrated as a 4×4 array in FIG. 1B, the four groups 10, 20, 30 and 40 may have any number of individual primary light sources 110, 120, 130 and 140, and various other arrangements of the groups may be used.

Each of the four different primary light sources 110, 120, 130, and 140 may be disposed in different packages 151, 152, 153, and 153 respectively. Each of the four different primary light sources 110, 120, 130 and 140 are configured to separately emit an adjustable amount light 111, 121, 131, and 141, respectively, which have substantially different emissions spectra and color points, as will be described in more detail with respect to FIGS. 2 and 3 below. Lights 111, 121, 131 and 141 are combined in various amounts to form combined light 190, as will be described in more detail with respect to figures below.

Referring to FIG. 1A, each of the four different primary light sources may be pcLEDs and include a pump die and a downconverter. A first primary light source 110 includes a first pump die 112. First pump die 112 may be a violet pump die with a peak light emission wavelength between 420-440 nm, for example, the peak light emission wavelength may be around 430 nm. An example of a violet pump die that may be used in lighting device 100 includes a heterojunction based on a GaN or InGaN semiconductor.

First primary light source 110 includes a first downconverter 115. First downconverter 115 may contain a green phosphor having an emission spectrum with longer wavelengths, for example, with a peak light emission wavelength in the range of 530-580 nm. First downconverter 115 is chosen so as to minimize emission in the melanopic sensitivity range.

First downconverter 115 may include any downconverter material, such as a phosphor or quantum dot, that can be excited by wavelengths between 420-440 nm and that emits downconverted light having a peak wavelength in the range of 530-580 nm. Suitable green phosphor materials for use as first downconverter 115 may include, for example, aluminum garnet phosphors. Examples of green phosphors that may be used include aluminum garnet phosphors with the general formula $(Lu_{1-x-y-a-b}Y_xGd_y)_3(Al_{1-z}Ga_z)_5O_{12}:Ce_aPr_b$ wherein $0<x\leq1$, $0<y\leq1$, $0<z\leq0.1$, $0<a\leq0.2$ and $0<b\leq0.1$, such as $Lu_3Al_5O_{12}:Ce^{3+}$ and $Y_3Al_5O_{12}:Ce^{3+}$ which emit light in the yellow-cyan range. Additional examples of suitable green phosphors include but are not limited to $Lu_{3-x-y}M_yAl_{5-z}A_zO_{12}:Ce_x$ where M=Y, Gd, Tb, Pr, Sin, Dy; A=Ga, Sc; and $(0<x\leq0.2)$; $Ca_{3-x-y}M^PSc_{2-y}A_zSi_3O_{12}:(Ce_x$ where M=Y, Lu; A=Mg, Ga; and $(0<x\leq0.2)$; $Ba_{2-x-y}M_ySiO_4$: $Eu_x$ where M=Sr, Ca, Mg and $(0<x\leq0.2)$; $Ba_{2-x-y-z}M_yK_z$ $Si_{1-z}P_zO_4Eu_x$ where M=Sr, Ca, Mg and $(0<x\leq0.2)$; $Sr_{1-x-y}$ $M_yAl_{2-z}Si_zO_{4-z}N_z:Eu_x$ where M=Ba, Ca, Mg and $(0<x\leq0.2)$; $M_{1-x}Si_2O_2N_2:Eu_x$ where M=Sr, Ba, Ca, Mg and $(0<x\leq0.2)$; $M_{3-x}Si_6O_9N_4:Eu_x$ where M=Sr, Ba, Ca, Mg and $(0<x\leq0.2)$; $M_{3-x}Si_6O_{12}N_2:Eu_x$ where M=Sr, Ba, Ca, Mg and $(0<x\leq0.2)$; $Sr_{1-x-y}M_yGa_{2-z}Al_zS_4:Eu_z$ where M=Ba, Ca, Mg and $(0<x\leq0.2)$; $Ca_{1-x-y-z}M_zS:Ce_xA_y$ where M=Ba, Sr, Mg; A=K, Na, Li; and $(0<x\leq0.2)$; $Sr_{1-x-y-z}M_zAl_{1+y}Si_{4.2-y}N_{7-y}O_{0.4+y}:Eu_x$ where M=Ba, Ca, Mg and $(0<x\leq0.2)$; $Ca_{1-x-y-z}M_ySc_2O_4$: $Ce_xA_z$ where M=Ba, Sr, Mg; A=K, Na, Li; and $(0<x\leq0.2)$; $M_{x-z}Si_{6-y-2x}Al_{y+2x}O_yN_{8-y}:Eu_z$ where M=Ca, Sr, Mg and $(<x\leq0.2)$; and $Ca_{8-x-y}M_yMgSiO_4Cl_2:Eu_x$ where M=Sr, Ba and $(0<x\leq0.2)$.

A portion (e.g., 60% or less by radiant flux) of the light emitted by first pump die 112 is absorbed by first downconverter 115 and down-converted to the longer wavelengths, and a portion (e.g., 40% or more by radiant flux) of the light emitted by first pump die 112 is not absorbed. First primary light source 110 emits first light 111 that contains both unconverted light from violet pump die 112 and light converted to longer wavelengths by first downconverter 115. Light 111 will be described in more detail with respect to FIGS. 2 and 3 below.

A second primary light source 120 may include a second pump die 122. Second pump die 122 may be a cyan-blue pump die with a peak or dominant light emission wavelength between 470-500 nm, for example, the peak light emission wavelength may be around 485 nm. An example of a cyan-blue pump die for use in the second primary light sources 120 includes a heterojunction based on an InGaN semiconductor.

Second primary light source 120 includes a second downconverter 125. Second downconverter 125 may also contain a green phosphor, but the green phosphor used as second downconverter 125 may have an emission spectrum with more spectral content in shorter wavelengths so as to further enhance emission in the melanopic sensitivity range. For example, the second downconverter may have a peak light emission wavelength in the range of 495-580 nm. Second downconverter 125 may include any downconverter material, such as a phosphor or quantum dot, that can be excited by wavelength between 470-500 nm and that emits downconverted light having a peak wavelength in the range of 495-580 nm. Suitable materials for use as second downconverter 125 may include the same green phosphor materials as the first downconverter 115, however, a suitable combination of host composition and activator are selected to provide the desired spectral content in the shorter wavelength range.

A portion (e.g., <50% by radiant flux) of the light emitted by second pump die 122 is absorbed by the second downconverter 125 and down-converted to the longer wavelengths, and a portion (e.g., >50%) of the light emitted by second pump die 122 is not absorbed. Second primary light source 120 emits second light 121 that contains both unconverted light from pump die 122 and light converted to longer wavelengths by the downconverter 125. Light 121 will be described in more detail below with respect to FIGS. 2 and 3.

A third primary light source 130 may include a third pump die 132. Third pump die 132 may be a royal-blue pump die with a peak wavelength between 440-460 nm. In third primary light source 130, the light emitted from pump die 132 is nearly fully converted by a third downconverter 135, and therefore the pump wavelength may be chosen for efficiency and flux performance in exciting third downconverter 135, rather than spectral properties in the light emitted by the third primary light source 130. Thus, any pump die that efficiently excites third downconverter 135 may be used. An example of a royal-blue pump die for use in third primary light source 130 includes a heterojunction based on an InGaN semiconductor.

Third downconverter 135 emits wavelengths in the range of 530-580 nm. Third downconverter 135 may contain at least one green phosphor, for example an aluminum garnet phosphor. Third downconverter 135 may include any downconverter material, such as a phosphor or quantum dot, that can be excited by light emitted by the third pump die and that emits downconverted light in the green region, with a peak light wavelengths in the range of 530-580 nm. The downconverter material used in third downconverter 135 may be the same as the downconverter material used in the first primary downconverter 115.

Most to all of the light emitted by the third pump die 132 is absorbed by third downconverter 135 and converter to longer wavelengths. Third primary light source 130 emits a third light 131, which contains little to no unconverted light from pump die 132 and most to all light converted to longer wavelengths by the downconverter 135. Light 132 will be described in more detail below with respect to FIGS. 2 and 3.

A fourth primary light source 140 may include a fourth pump die 142. Fourth pump die 142 may also be a royal-blue pump die with a peak wavelength between 440-460 nm. In the fourth primary light source 140, the light emitted from fourth pump die 142 is also nearly fully converted by a fourth downconverter 145, and therefore the pump wavelength may likewise be chosen for efficiency and flux performance rather than spectral properties, and may be a same type of pump die as in third primary light source 130. Any pump die that efficiently excites downconverter 135 may be used. An example of a royal-blue pump die for use in fourth primary light source 140 includes a heterojunction based on an InGaN semiconductor.

Fourth downconverter 145 emits wavelengths in the range of 580-660 nm. Fourth downconverter 145 may include any downconverter material, such as a phosphor or quantum dot, with peak light emission in the red region, with a peak light emission wavelength in the range of 580-660 nm. For example, the fourth primary light source downconverter 145 may contain at least one red phosphor, which may be, for example, be a SCASN or CASN phosphor. To support high color fidelity of combined light 190 at color points that have low CCT values, fourth primary light source 140 should have sufficient spectral content wavelengths in the deep red region (~640-660 nm). In one example, one of the phosphors included in the fourth downconverter 145 is a narrow red phosphor such as SLA, allowing the deep red spectral content to be realized with high luminous efficacy. Most to all of the light emitted by the fourth pump die 142 is absorbed by fourth downconverter 145 and converter to longer wavelengths. Fourth primary light source 140 emits a fourth light 141, which contains little to no unconverted light from pump die 142 and most or all light converted to longer wavelengths by fourth downconverter 145. Light 142 will be described in more detail below with respect to FIGS. 2 and 3.

Figure 2:
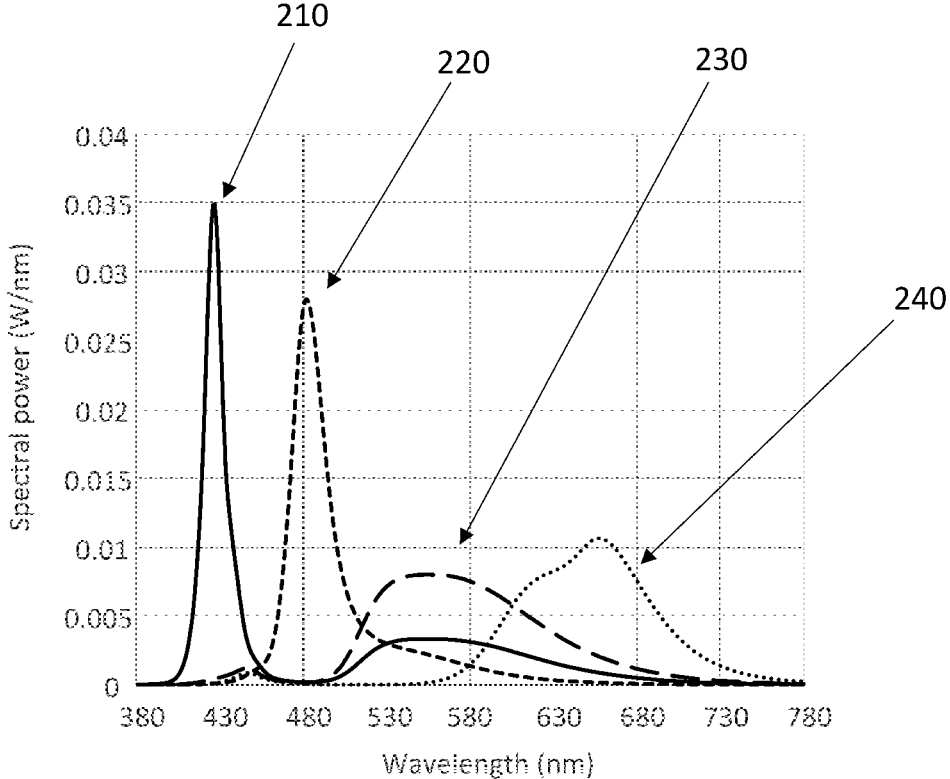
FIG. 2 shows a spectral power distribution of each of the primary light sources according to an example embodiment.

FIG. 2 shows example spectral power distributions of each of the primary light sources, normalized to the radiant flux of 1 W. The spectral power emission spectra for light 111, 121, 131, and 141 emitted by each of the four primary light sources 110, 120, 130, and 140 are shown.

Referring to FIG. 2, light 111 emitted by the first primary light source 110 may have a spectral power emission spectrum such as, for example, spectrum 210 shown in FIG. 2. Features of a spectral power emission spectrum of light 111 include a narrow first peak over a wavelength range of 400-455 nm with a maximum in the range of 420-440 nm and a broader and less intense second peak over the range of approximately 500-700 nm with a maximum between 530-580 nm due to the presence of the green phosphor. A proportion of light in spectral power emission spectrum of light 111 also includes a cyan gap region corresponding to the melanopic sensitivity range. In particular, the spectral power emission spectrum of light 111 emitted by the first primary light source 110 may have a cyan gap with little or no spectral power in a range of 470 nm-490 nm and have a "U" shape with the spectral power decreasing to essentially zero from 447 to 470 nm, remaining essentially zero from 470-490 nm, and then slowly increasing between 490 and 531 nm, so that the spectral content value at 531 nm remains less than the spectral content value at 447 nm. The spectral content between 447 and 531 nm may be less than 15% of the spectral content of the entire first light emission spectrum. The MDER of the light 111 emitted from first primary light source 110 is less than 0.35. For example, in the example emission spectrum 210 shown in FIG. 2, the MDER is 0.22.

Light 121 emitted by second primary light source 120 may have a spectral power emission spectrum such as, for example, emission spectrum 220 shown in FIG. 2. Features of a spectral power emission spectrum emitted by light 121 include a peak over a wavelength range of 450-510 nm, with a maximum in the range of 470-500 nm, for example at 485 nm. This peak corresponds to the peak of the melanopic response function. The MDER of the light 121 emitted by the second primary light source 120 is greater than 0.65. For example, in the emission spectrum 220 of FIG. 2, the MDER of the light 121 is 0.80. The emission spectrum of light 121 may also have spectral content in the range of 530-580 nm due to the presence of the green phosphor, for example, emission spectrum 220 includes a shoulder area with spectral content at 510 nm gradually tapering off to zero at about 630 nm.

Light 131 emitted by third primary light source 130 may have a spectral power emission spectrum such as, for example, emission spectrum 230 shown in FIG. 2. Light 131 is a green light, and includes a peak in the range of 530-580 nm.

Light 141 emitted by fourth primary light source 140 may have a spectral power emission spectrum such as, for example emission spectrum 240 shown in FIG. 2. Light 141 is a red light, and includes a peak in the range of 600-700 nm. As noted above and as shown in the emission spectrum 240 of FIG. 2, light 141 may include a significant spectral content in the deep red region (~640-660 nm).

Figure 3:
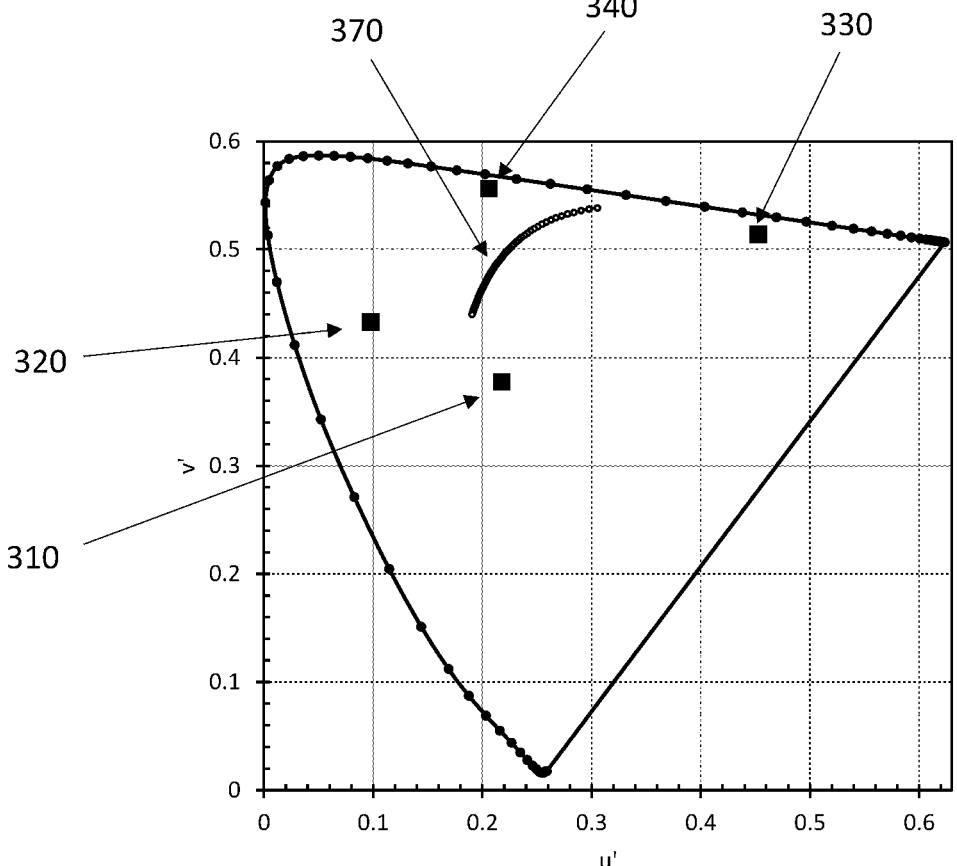
FIG. 3 is a CIE1976 color diagram showing color points of light for each example emission spectra shown in FIG. 2.

FIG. 3 is a CIE1976 color diagram showing color points of light for the example emission spectra shown in FIG. 2. In FIG. 3, light 111 having an example emission spectrum 210 in FIG. 2 has color point 310 at u'=0.2177, v'=0.3775, light 121 having an example emission spectrum 220 in FIG. 2, has color point 320 at u'=0.0977, v'=0.4326, light 131 having an example emission spectrum 230 in FIG. 2, has color point 330 at u'=0.4527, v'=0.5138, and light 141 having an example emission spectrum 240 in FIG. 2 has color point 340 at 0.2059, v'=0.5563.

The example spectra and color points shown in FIGS. 2 and 3 are illustrative of light from an example set of four primary light sources that may be used to form lighting device 100. However, the spectra and color points of the four primary light sources 110, 120, 130 and 140 may be varied within certain ranges and still achieve a lighting device 100 having the characteristics disclosed herein. For example, in the first primary light source, an amount or type of green phosphor may be modified to modify the amount of green spectral content relative to violet spectral content in emissions spectrum 210, which would also modify the position of the color point 310. In general, the color points of light emitted by each of the four primary light sources may be varied. Light 111 emitted by primary light source 110 may have a color point in the range of 0.18<u'<0.4, v'<0.42. Light 121 emitted by primary light source 120 may have a color point in the range of u'<0.18, v'>0.25. Light 131 emitted by primary light source 130 may have a color point in the range of 0.18<u'<0.25, v'>0.53. Light 141 emitted by primary light source 140 may have a color point in the range of u'>0.35, v'>0.50.

Referring to FIG. 1A, the light 111, 121, 131, and 141 emitted by each of the primary light sources 110, 120, 130 and 140 combines to form a combined light 190. Each of the primary light sources 110, 120, 130, and 140 have individual electrical connections 161, 162, 163, and 164 that allow each of the primary light sources to be individually addressable. Hence the amount of light 111, 121, 131, and 141 contributing to the combined light 190 can be individually controlled by controlling the bias, i.e., the amount of electrical current, provided to each primary light source 110, 120, 130, and 140. By modifying the amounts of light 111, 121, 13, and 141, the characteristics of the combined light 190 can be modified.

FIG. 3 also shows a black body locus ("BBL") 370 from 2000-10000K. The light 111, 121, 131, and 141 emitted from each of the four primary light sources 110, 120, 130 and 140 may be combined together in various predetermined amounts to form a combined light 190 having color gamut that encompasses at least the BBL for CCTs from 2700K to 6500K. In particular, the color gamut of the combined light 190 covers a CCT range from 2000K to 10000K (which is the section of the BBL 370 that is shown in FIG. 3). For low CCTs (lower than ~2200K), maintaining a color point on the BBL requires very saturated red and green primaries, which includes efficacy in practical LED devices. Therefore, a gamut that can show these CCTs only below the BBL may be acceptable and preferred, as long as Duv (distance to BBL in CIE1960 color space) is within reasonable limits, for example with Duv not less than –0.006.

An advantage of the lighting device 100 disclosed herein, is that it allows for additional spectral characteristics to be optimized at a given color point and luminous flux of the combined light 190. That is, because there are multiple combinations of the light 111, 121, 131, and 141 from the four primary light sources that produce a combined light 190 at the desired CCT and luminous flux, it is possible to also optimize for additional characteristics of the combined light, such as color fidelity and color rendering characteristics, as well as melanopic content.

Combinations of bias values for each of the four primary light sources can be determined for lighting device 100 to emit a combined light 190 having a particular luminous flux and color point within the gamut, such as a white light falling on a particular color point on the BBL 370. For a given target luminous flux and color point within the gamut, the problem of determining the appropriate bias on each of the four primary light sources 110, 120, 130 and 140 for achieving the particular target color point and luminous flux is an underdetermined system by one degree of freedom. Therefore, an infinite number of solutions exist within a one-dimensional solution space, and further optimization parameters and constraints can be used to determine the choice of bias values. Such additional optimization parameters and constraints may include, for example, a desired color fidelity as shown below with respect to FIGS. 4, 5, and 6. This optimization is done by calculating one or more of these key spectral performance metrics for a set of spectra spread across the solution space in discrete steps, so that the desired spectrum may be selected based on these metrics.

Figure 4:
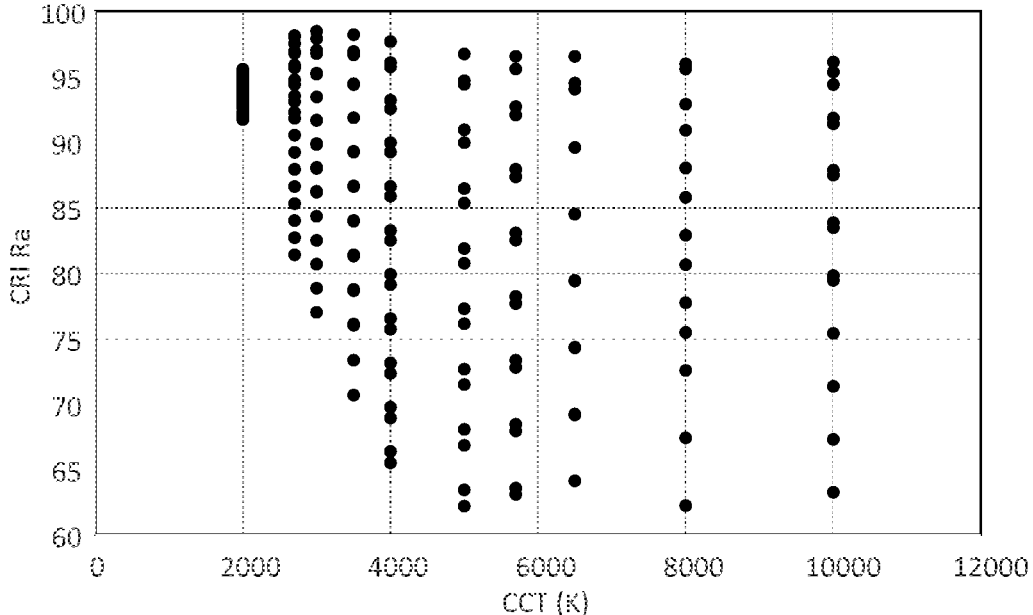
FIG. 4 is a plot of the color rendering index CRI Ra at 10 color points on the black body locus (CCT(K)) for 21 sample combinations of the four primary light sources that form a combined light (white light) at each CCT value.

FIG. 4 shows an example of optimizing the color rendering index CRI Ra (CIE 13:3:1995) of the combined light 190 at specific color points. FIG. 4 is a plot of the color rendering index CRI Ra (CIE 13:3:1995) at 10 color points on the black body locus (CCT(K)) between 2,000K and 10,000K (where 2000K is slightly below the BBL with a Duv=−0.003) for 21 sample combinations of the four primary light sources 110, 120, 130, and 140 that form a combined light 190 (which is a white light) at each CCT value. Viewing FIG. 4, for 10 color points on the BBL having CCT values ranging from 2000-10000K, 21 different combinations of the four primary source lights, i.e., 21 combinations of bias values, that produce a combined light 190 having that CCT were determined. At each CCT value, the 21 bias combinations producing that CCT value were spread over a solution space that included a maximum amount of one of the primary light sources (light 121) at one end, and a minimum amount of that primary light source at the other, with the remaining 19 values spread between the maximum and minimum. The resulting Ra of each of the 21 combinations at each CCT is plotted. That is, each dot represents a resulting Ra value for one of the combinations of light 111, 121, 131, and 141 resulting in a combined light 190 having that CCT value. For each of the CCTs in this range, there exists a combination of light 111, 121, 131, and 141, i.e., a combination of biases for primary light sources 110, 120, 130, and 140, that results in a combination light 190 that has a particular CCT value and a CRI Ra that is >95. Thus, CRI Ra values of combined light 190 at a particular color point may be optimized using light emitting system 100.

It should also be noted that it is possible to extend this CCT range down to 1800K by using a lighting device 100 in which more deep red spectral content (~640-660 nm) is added to the fourth primary light source 140. However, modifying the fourth primary light source in this way may reduce the efficacy and flux of lighting device 100.

Figure 5:
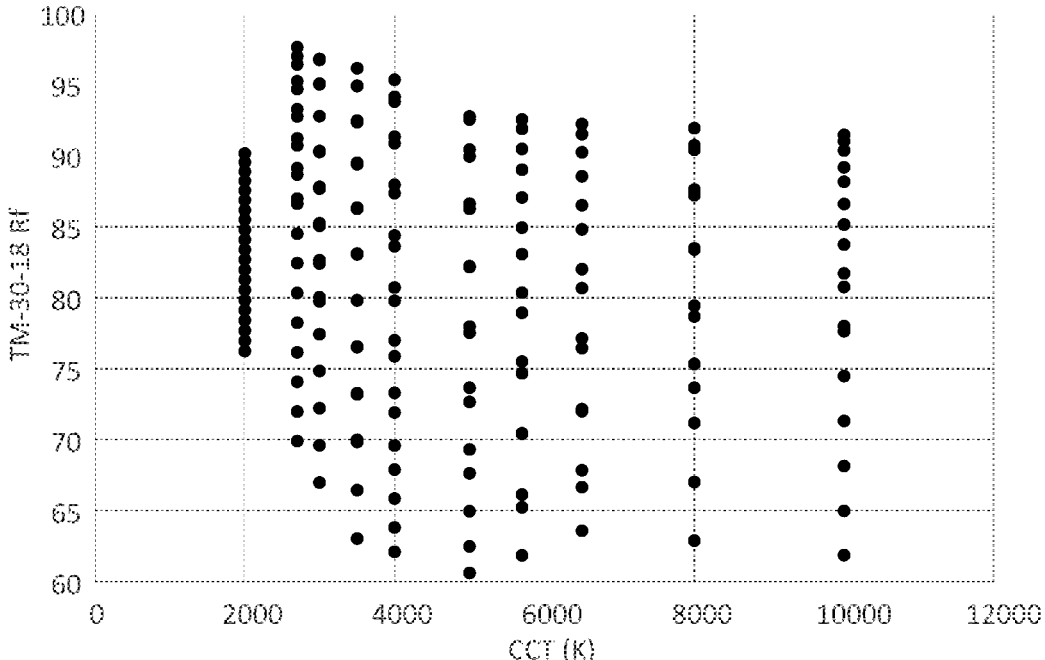
FIG. 5 is a plot of the ANSI/IES TM-30-18 Rf at 10 color points on the black body locus (CCT(K)) for the 21 sample combinations of the four primary light sources that form a combined light (white light) at each CCT value.

FIG. 5 shows an example of optimizing for color fidelity values TM-30-18 Rf of the combined light 190 at particular CCT color values. FIG. 5 is a plot of the ANSI/IES TM-30-18 Rf at 10 color points on the black body locus (CCT(K)) for the 21 sample combinations of the four primary light sources that form a combined light (white light) at each CCT value. The same 21 combinations of light 111, 121, 131, and 141, i.e., those same 21 combinations of bias values, used for FIG. 4 were used for the plot in FIG. 5. For those 21 combinations, the TM-30-18 Rf values were determined. Each dot in FIG. 5 represents a resulting Rf value for one of the combinations of light 111, 121, 131, and 141 resulting in a combined light 190 having that CCT value. For each of the CCT values in this range, there exists a combination of light 111, 121, 131, and 141 resulting in a combined light 190 that has a particular CCT and a TM-30-18 Rf value that is >90. Thus, TM-30-18 Rf values of combined light 190 at a particular color point may be optimized using light emitting system 100.

Figure 6:
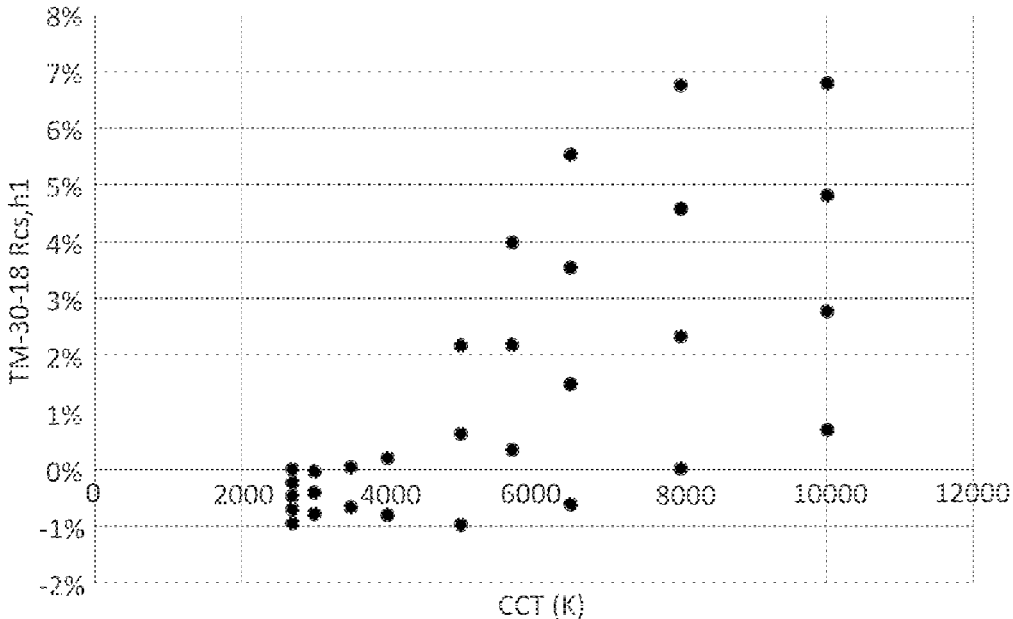
FIG. 6 is a plot of the ANSI-IES TM-30-18 Rcs,h1 (chroma shift from red hue bin) at 10 color points on the black body locus (CCT(K)) for a set of sample combinations of the four primary light sources that form a combined light (white light) at each CCT value and that meet the criteria for subjective preference: Rf>78, Rg>95, and −1%<Rcs, 1h<15%.

FIG. 6 shows an example of optimizing combined light 190 at particular CCT color point values based on subjective preferences of certain color rendering characteristics. According to prior studies, subjective color rendering preference correlates with a positive red chroma shift Rcs,h1, where Rf>78, Rg>95 and −1%<Rcs,h1<15%. FIG. 6 is a plot of the ANSI-IES TM-30-18 Rcs,h1 (chroma shift from red hue bin) at 10 color points on the black body locus (CCT(K)) for a set of sample combinations of the four primary light sources that form a combined light (white light) at each CCT value and that meet the criteria for subjective preference: Rf>78, Rg>95, and −1%<Rcs, 1h<15%. FIG. 6 shows the range of Rcs,h1 values for the combinations of light 111, 121, 131, and 141 determined above with respect to FIG. 4 and FIG. 5 in which Rf>78 and Rg>95, and in which the red chroma shift falls within the subjectively preferred range, −1%<Rcs,h1<15%. FIG. 6 shows that reds can be significantly oversaturated beyond what is commonly possible with LEDs optimized for color fidelity and luminous efficacy. (Also here, it is possible to extend the oversaturation capabilities to lower CCTs by adding more deep red content to the fourth primary light source 140 at the expense of lower efficacy and flux.)

Figure 7A:
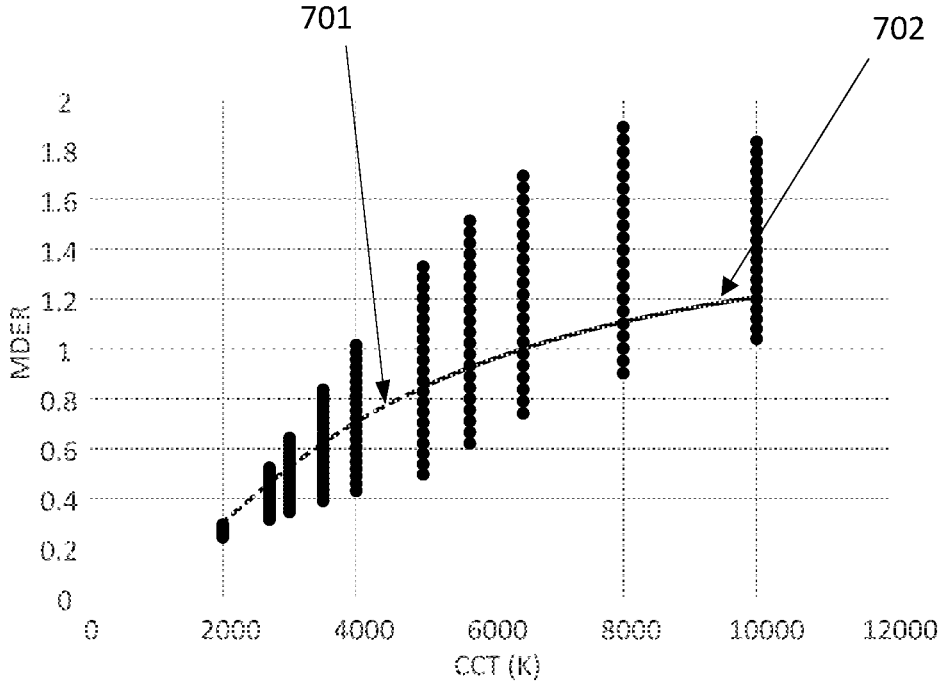
FIG. 7A is a plot of melanopic daylight efficacy ratio (MDER) per CIE S026:2018 at 10 color points on the black body locus (CCT(K)) for a set of sample combinations of the four primary light sources that form a combined light (white light) at each CCT value and are spread out over the possible range of MDER values at the CCT value.
Figure 7B:
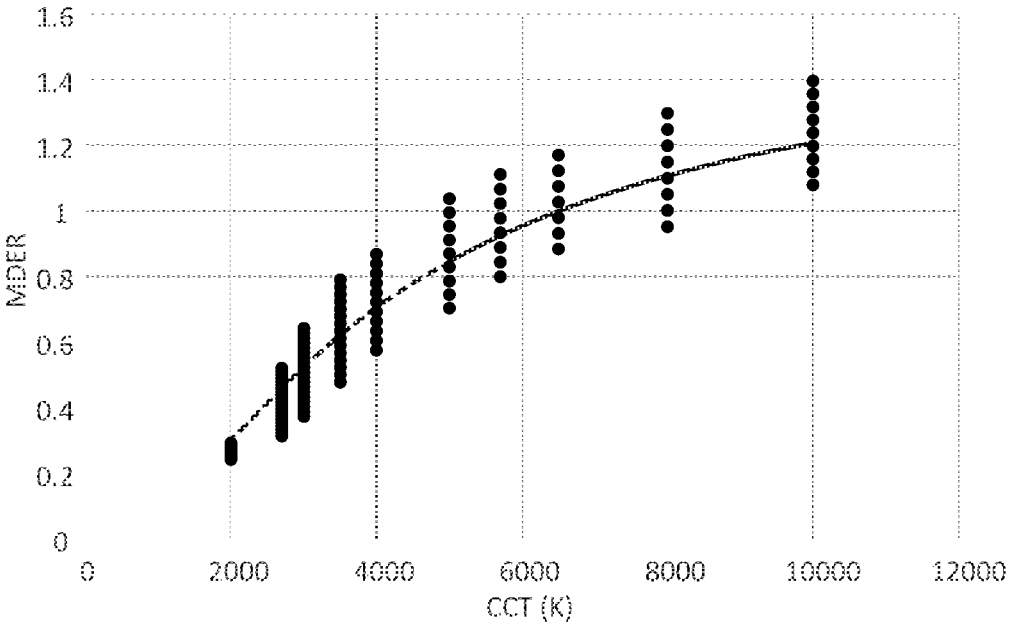
FIG. 7B is a plot of melanopic daylight efficacy ratio (MDER) per CIE S026:2018 at 10 color points on the black body locus (CCT(K)) for a set of sample combinations of the four primary light sources that form a combined light (white light) at each CCT value and that also have Ra values>80 at the CCT value.

Melanopic content, as measured by the melanopic daylight (D65) efficacy ratio ("MDER") per CIE S026:2018 can also be varied in the spectra of combined light 190 while maintaining a particular color value and luminous flux. FIG. 7A is a plot of MDER at 10 color points on the black body locus (CCT(K)) for a set of sample combinations of the four primary light sources that form a combined light 190 (which is white light as is on BBL) at each CCT value and are spread out over the possible range of MDER values at the CCT value. FIG. 7B shows the same MDER vs. CCT(K) plot as FIG. 7A, but only sample combinations of the four primary light sources resulting in combined light 190 (white light) that also have Ra>80 are shown. In both FIG. 7A and FIG. 7B, dots represent a sample combined light 190 (white light) at the particular CCT(K) value. For reference, the dashed black line 701 is the MDER values for a black body radiator (below CCT values of 5000K), and the solid black line 702 shows the MDER values of a CIE D illuminant (above CCT values of 5000K).

Viewing FIGS. 7A and 7B, the melanopic content (MDER) can be tuned significantly above and below MDER values of the reference source (701, 702) while, as shown in FIG. 7B, maintaining adequate color fidelity. Viewing FIG. 7A, MDER can be as low as 0.25 at 2000K to as large as 1.89 at 8000K. At a set CCT value, the MDER can also be varied over a wide range, for example, at a CCT of 4000K, MDER varies from 0.43 to 1.0. A wider range of MDER may also be achieved by slightly varying the CCT value over a smaller range. For example, at CCT of 6500 the lowest MDER value is 0.74 and the highest MDER value is 1.69, by moving the CCT value of the white light to 5000K, a lower MDER value of 0.5 can be achieved. Viewing FIG. 7B, the range of MDER value, in particular the upper ranges, are attenuated when the combination light 190 also has an Ra>80. So, for example, at a CCT of 2000K, MDER can still be as low as 0.25, but the highest MDER is 1.39, at 10,000K. At a set CCT value and Ra>80, MDER can range, for example, between 0.57 and 0.83. A broader range of MDER values can be achieve by slightly varying the CCT(K) similar to what was described above with respect to FIG. 7A. For example, at a CCT value of 5000K and Ra>80, and MDER value can be as low as 0.57, and at a CCT value of 6500K with Ra>80 the MDER value can go up to 1.17. The range of available MDER values that can be obtained with lighting device 100 may be further expanded tuning the combination light 190 to color points that are not on the BBL, i.e., where Duv is not zero. For example, a higher MDER may be obtained by tuning the color point of combination light 190 below the BBL, and a lower MDER may be obtained by tuning the color point of combination light 190 above the BBL.

FIGS. 8A, 8B, and 8C illustrate various example implementations of the lighting device as disclosed herein with a controller for controlling the bias (electrical input power) applied to each of the primary light sources. In FIG. 8A, a controller 851 is included within the housing 811 of the lighting device 801. Each of the primary light sources 841 has a corresponding electrical connector 871 (corresponding, for example, to individual electrical connections 161, 162, 163, and 164 of FIG. 1A) connected directly to controller 851. Controller 851 may include various components for operating the primary light sources 841, and may include, for example, a memory component 854 and an interface component 855 allowing a user to operate the controller 851. In FIG. 8B, the controller 856 is not within the housing of lighting device 802, but is a separate, external device. Controller 856 is electrically connected to electrical connectors 872 (corresponding, for example, to individual electrical connections 161, 162, 163, and 164 of FIG. 1A) of lighting device 802 through a separate cable 859 or other wiring, or wirelessly, that allows the controller 856 to be disconnected and separated from lighting device 802. Controller 856 may include various components for operating the primary light sources 842, and may include, for example, a memory component 857, and an interface component 858, which allows a user to operate the controller 851. In FIG. 8C, the controller is divided into an internal portion 881, which in within housing 813 of lighting device 803, and an external portion 883 that is connected to internal portion 881 via a cable 886, or other wiring, or wirelessly. External portion 883 can be disconnected from lighting device 803. Each of the primary light sources 843 has a corresponding electrical connector 873 (corresponding, for example, to individual electrical connections 161, 162, 163, and 164 of FIG. 1A) connected directly to internal portion 881 of the controller. The internal 881 and external 883 portions of the controller may also include internal components for operating the primary light sources 843, and may include, for example, memory, 882, 884, and interface components 888, 889. A portion of the information, interface and/or other control function may be divided between components in the internal portion 881 and external portion 883, or may be all within one or the other of the internal portion 881 and external portion 883 of the controller.

Various methods may be used for operating the controller 851, 856, and 881/883, and determining and inputting bias values used to operate of the lighting device 100 from the controller 851, 856, and 881/883. In a basic method of operation, the bias values are directly input, and controller 851, 856, and 881/883 has a "dial" function that can input just the bias values to be used for each group of primary light sources.

In another example, the controller 851, 856, 881/883 includes integrated data, and inputs to the controller 851, 856, 881/883 may include the desired color point (for example expressed in CCT, Duv coordinates), intensity (dimming level) and a parameter describing the desired spectral performance. These inputs may take the form of different settings, such as "maximum fidelity", "maximum color saturation", "maximum melanopic content" and "minimum melanopic content". The memory component 854, 857, 882/884 of controller 851, 856, 881/883 may store, for a discrete set of color points, the primary bias values corresponding to the different settings are stored. These values may be calculated offline and be stored as a lookup table in the memory. Interpolation may be used to determine appropriate bias values for color points in between the discrete set of precalculated color points.

In further examples of methods for operating controller 851, 856, 881/883, presets or algorithms may be programmed in which two or more of the inputs are coupled in a predefined way. For example, a "preferred color" preset may link the Duv and spectral setting inputs to the CCT input, such that the user or external controller only sets the CCT and intensity level. In another example, a "circadian" preset may have only a single external input which controls CCT, Duv, intensity and spectral setting. Such a preset could then provide dim, warm-white light, on the BBL, with minimized melanopic content on one end of the external input scale and bright cool-white light, above the BBL, with maximized melanopic content on the other end of the scale. In yet another example, external inputs may be added to the integrated controller, such as time of day, occupancy level or ambient light level, so that the presets may be dependent on these external inputs.

Figure 9A:
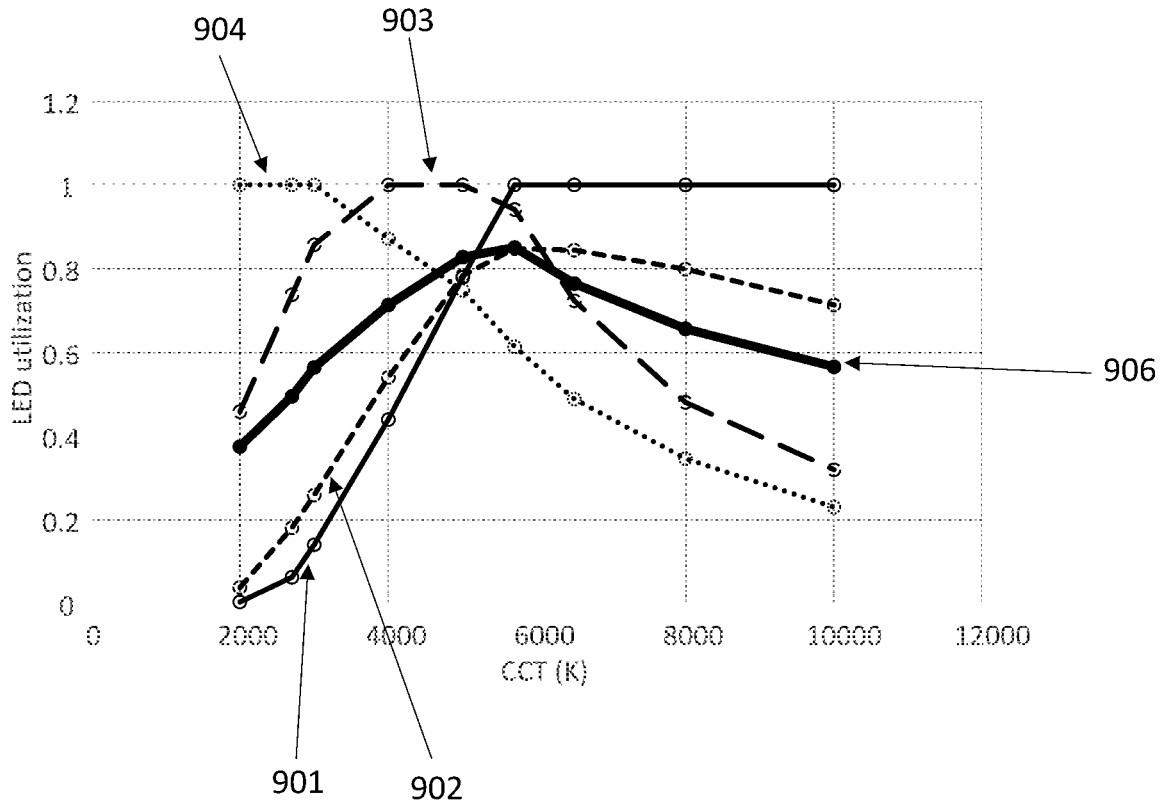
FIG. 9A is a plot of LED utilization as a function of CCT(K) values for each primary light source and for the average of all primaries, for the bias setting that produce combination light with the highest CRI Ra at the respective CCT(K).
Figure 9B:
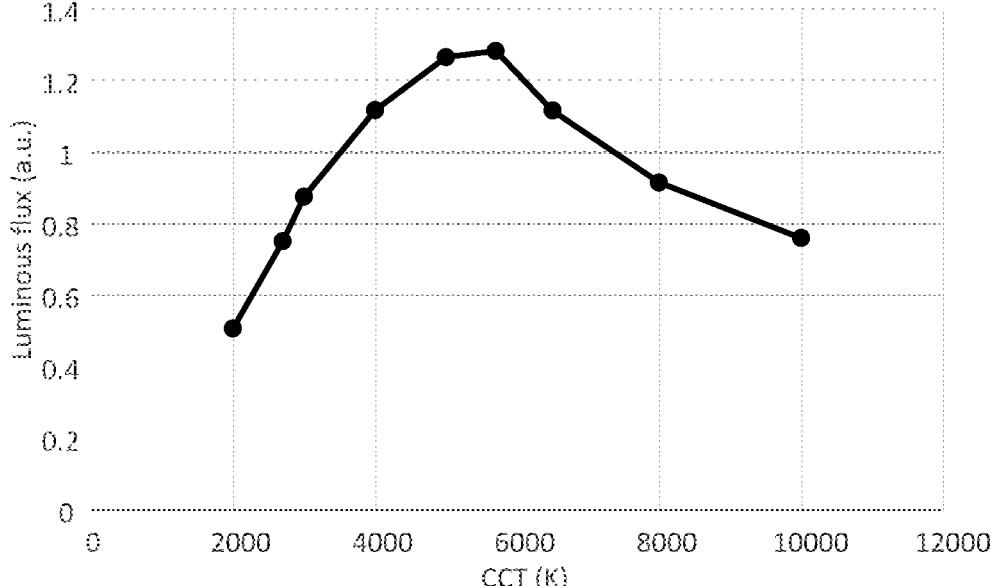
FIG. 9B is a plot of normalized luminous flux for the combination light with the highest CRI Ra as a function of CCT(K).

FIG. 9A is a plot of LED utilization as a function of CCT(K) values for each primary light source and for the average of all primaries, for the bias setting that produce combination light with the highest CRI Ra at the respective CCT(K), and FIG. 9B is a plot of normalized luminous flux for the combination light with the highest CRI Ra as a function of CCT(K). In FIG. 9A, plot 901 is from primary light source 110, plot 902 is from primary light source 120, plot 903 is from primary light source 130, plot 904 is from primary light source 140, and plot 906 is the average of all primaries. Lighting device 100 is capable of maintaining a high average LED utilization over a wide CCT range, as illustrated in FIG. 9A. For the purpose of illustration, it is assumed in FIGS. 9A (and 9B) that each primary LED emits the same radiant flux at its nominal operating condition. (In practice, when all primary LEDs are implemented in the same device architecture, the second and fourth primary will have somewhat lower flux due the lower power conversion efficiency of long-wavelength blue for the second primary, and due to quantum efficiency and Stokes losses for the fourth primary.) Over most of the CCT range, the average utilization is greater than 50%. FIG. 9B shows normalized luminous flux vs. CCT under the same assumption.

Flux and efficacy are furthermore optimized in lighting device 100 due to (i) separation of the green and red phosphors, which avoids losses associated with light from a primary light sources being down-converted twice, by two different phosphors, and (ii) having most of the phosphor pumped by highly efficient royal-blue LEDs. By contrast, prior art LEDs that provide a white spectrum optimized for melanopic content in a single package inevitably pump most of the phosphor with less efficient violet or long-wavelength blue LEDs.

This disclosure is illustrative and not limiting. Further modifications will be apparent to one skilled in the art in light of this disclosure and are intended to fall within the scope of the appended claims.

What is claimed is:

1. A lighting device comprising:

a first primary light source, the first primary light source comprising a first pump die configured to emit first pump light having a peak light emission wavelength in a range of 420-440 nm, and a first downconverter configured to absorb a portion of first pump light and emit a first downconverter light having a peak emission in a wavelength range of 530-580 nm, a portion of unconverted first pump light and first downconverter light combine to form a first light;

a second primary light source, the second primary light source comprising a second pump die configured to emit second pump light having a peak light emission wavelength in a range of 470-500 nm, and a second downconverter configured to absorb a portion of second pump light and emit a second downconverter light having a peak emission in a wavelength range of 495-580 nm, a portion of unconverted second pump light and second downconverter light combine to form a second light;

a third primary light source, the third primary light source comprising a third pump die configured to emit third pump light having a peak light emission wavelength in a range of 440-460 nm, and a third downconverter configured to absorb substantially all third pump light and emit a third downconverter light having a peak emission in a wavelength range of 530-580 nm, substantially all of the third pump light is converted to third downconverter light to form a third light; and a fourth primary light source, the fourth primary light source comprising a fourth pump die configured to emit fourth pump light having a peak light emission wavelength in a range of 440-460 nm, and a fourth downconverter configured to absorb substantially all fourth pump light and emit a fourth downconverter light having a peak emission in a wavelength range of 580-660 nm, substantially all of fourth downconverter light is converted to form a fourth light.

2. The light emitting device of claim 1, wherein the first light has an MDER less than 0.35.

3. The light emitting device of claim 1, wherein second light has an MDER greater than 0.65.

4. The lighting device of claim 1, wherein first primary light source comprises a first electrical connection for providing a first bias to the first pump die, the second primary light source comprises a second electrical connection for providing a second bias to the second pump die, the third primary light source comprises a third electrical connection for providing a third bias to the third pump die, and the fourth primary light source comprises a fourth electrical connection for providing a fourth bias to the fourth pump die.

5. The lighting device of claim 4, further comprising a controller, the controller configured to independently input a first bias to control an amount of first light, a second bias to control an amount of second light, a third bias to control an amount of third light, and a fourth bias to control an amount of fourth light.

6. The light emitting device of claim 5, wherein the controller comprises a memory configured to store one or more sets of predetermined first, second, third, and fourth bias values for providing a combined light formed from the amount of first light, the amount of second light, the amount of third light, and the amount of fourth light, the combined light having a CCT value, a luminous flux value, and one of an Ra value, a TM-30-18 Rf value, an Rcs,h1value, or an MDER value.

7. The light emitting device of claim 6, wherein the combined light has a CCT value between 2000K and 10000K, a Ra value>80, and an MDER value between 0.25 to 1.39.

8. The light emitting device of claim 1, wherein the first light has a CIE 1976 color point in the range of $0.18<u'<0.4$, $v'<0.42$, the second light has a color point in the range of $u'<0.18$, $v'>0.25$, the third light has a color point in the range of $0.18<u'<0.25$, $v'>0.53$, and the fourth light has a color point in the range of $u'>0.35$, $v'>0.50$.

9. A light emitting device comprising:

a first primary light source configured to emit a first light having a CIE 1976 color point in the range of $0.18<u'<0.4$, $v'<0.42$;

a second primary light source configured to emit a second light having a CIE 1976 color point in the range of $u'<0.18$, $v'>0.25$;

a third primary light source configured to emit a third light having CIE 1976 color point in the range of $0.18<u'<0.25$, $v'>0.53$; and a fourth primary light source configured to emit a fourth light having a CIE 1976 color point in the range of $u'>0.35$, $v'>0.50$.

10. The lighting device of claim 9, wherein the first light has an MDER less than 0.35.

11. The lighting device of claim 9, wherein the second light has an MDER greater than 0.65.

12. The lighting device of claim 9, wherein an adjustable amount of the first light, an adjustable amount of the second light, an adjustable amount of the third light, and an adjustable amount of the fourth light are configured to combine to form a combined light.

13. The lighting device of claim 12, wherein the combined light maintains a Ra>90 for CCT(K) values between 2000K and 10000K.

14. The lighting device of claim 12, wherein the combined light has an MDER in the range of 0.25 to 1.39.

15. The lighting device of claim 12, wherein an MDER of the combined light can be varied between 90% to 100% of a reference source MDER while maintaining a set CCT(K) and a Ra>80, the reference source is a black body radiator below CCT values of 5000K, and a CIE D illuminant above CCT values of 5000K.

16. The lighting device of claim 9, wherein first primary light source comprises a first electrical connection for providing a first bias to the first pump die, the second primary light source comprises a second electrical connection for providing a second bias to the second pump die, the third primary light source comprises a third electrical connection for providing a third bias to the third pump die, and the fourth primary light source comprises a fourth electrical connection for providing a fourth bias to the fourth pump die.

17. The lighting device of claim 16, further comprising a controller electrically connected to each of the first electrical connection, second electrical connection, third electrical connection, and fourth electrical connection, the controller providing the first bias, second bias, third bias, and fourth bias, the controller including a memory, the memory configured to store first, second, third, and fourth bias values for producing a combined light with CCT(K) values in a range of 2000K to 10000K and MDER in a range of 0.25 to 1.39.

18. A lighting device comprising:
   a plurality of first primary light sources, each first primary light source comprising a violet pump die and green phosphor disposed on the violet pump die, the violet pump die and green phosphor contained in a first package;
   a plurality of second primary light sources, each second primary light source comprising a cyan-blue pump die and a green phosphor disposed on the cyan-blue pump die, the cyan-blue pump die and green phosphor contained in a second package and configured to emit a light having a CIE 1976 color point in the range of $u'<0.18$, $v'>0.25$;
   a plurality of third light sources, each third primary light source comprising a royal-blue pump die and a green phosphor disposed on the royal-blue pump die, the royal-blue pump die and green phosphor contained in a third package; and
   a plurality of fourth primary light sources, each fourth primary light source comprising another royal-blue pump die and a red phosphor disposed on the another royal-blue pump die, the another royal-blue pump die and red phosphor contained in a fourth package,
   the first, second, third, and fourth packages are each separate packages.

19. The lighting device of claim 18, wherein the first package emits a light having an MDER less than 0.35.

20. The lighting device of claim 18, wherein the second package emits a light having an MDER greater than 0.65.

* * * * *